United States Patent [19]
Sessions et al.

[11] Patent Number: 5,933,041
[45] Date of Patent: Aug. 3, 1999

[54] OUTPUT DRIVER WITH CONSTANT SOURCE IMPEDANCE

[75] Inventors: D. C. Sessions; Sung-Hun Oh, both of Phoenix; Elie Georges Khoury, Gilbert, all of Ariz.

[73] Assignee: VLSI Technology, Inc., San Jose, Calif.

[21] Appl. No.: 08/787,768

[22] Filed: Jan. 28, 1997

[51] Int. Cl.[6] .............................................. H03K 19/003
[52] U.S. Cl. ..................... 327/319; 327/379; 327/108; 327/388; 327/306; 327/318; 326/30
[58] Field of Search ..................... 327/108, 112, 327/365, 379, 384, 387, 362, 333, 388, 306, 315, 317, 318, 319; 326/33, 34, 21, 30, 86, 60

[56] References Cited

U.S. PATENT DOCUMENTS

| | | | |
|---|---|---|---|
| 5,168,176 | 12/1992 | Wanlass | 326/30 |
| 5,332,932 | 7/1994 | Runaldue | 326/33 |

*Primary Examiner*—Timothy P. Callahan
*Assistant Examiner*—Dinh Le
*Attorney, Agent, or Firm*—Harry M. Weiss; Jeffrey D. Moy; Harry M. Weiss & Associates, P.C.

[57] ABSTRACT

An improved output driver that minimizes source point reflections when driving a signal on a transmission line by generating a constant source impedance. The improved output driver uses a transistor switching circuit for generating a nearly constant channel impedance when transistor switching circuit is enabled and is not operating in a saturation mode. A switched diode circuit is coupled in parallel to the transistor switching circuit for generating a nearly constant source impedance when a sufficient voltage to bias the switch diode circuit is applied. Control circuitry is coupled to both the transistor switching circuit and to the switched diode circuit for enabling and disabling the transistor switching circuit and the switched diode circuit. By alternatively enabling and disabling the transistor switching circuit and the switched diode circuit the control circuit is able to generate a constant source impedance.

31 Claims, 4 Drawing Sheets

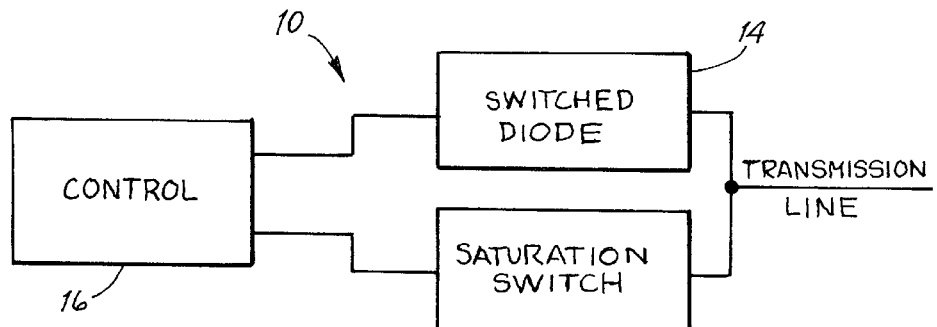
Fig. 1
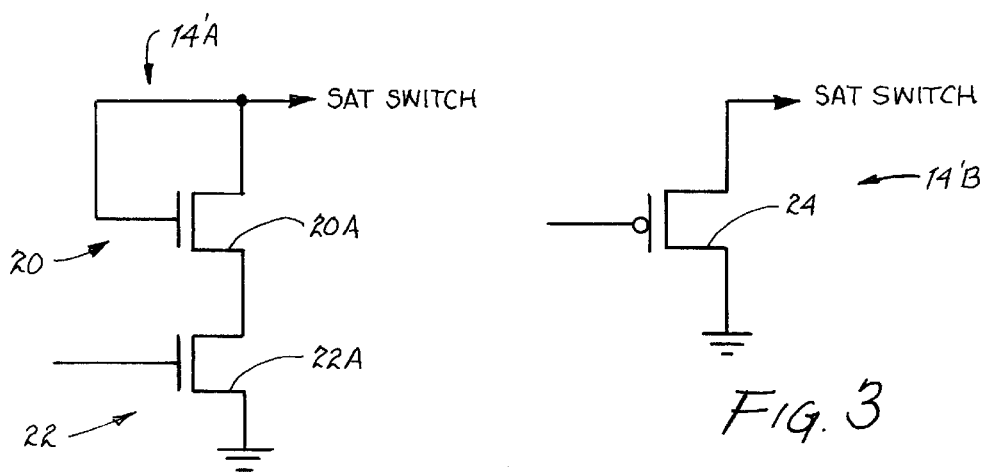
Fig. 2
Fig. 3
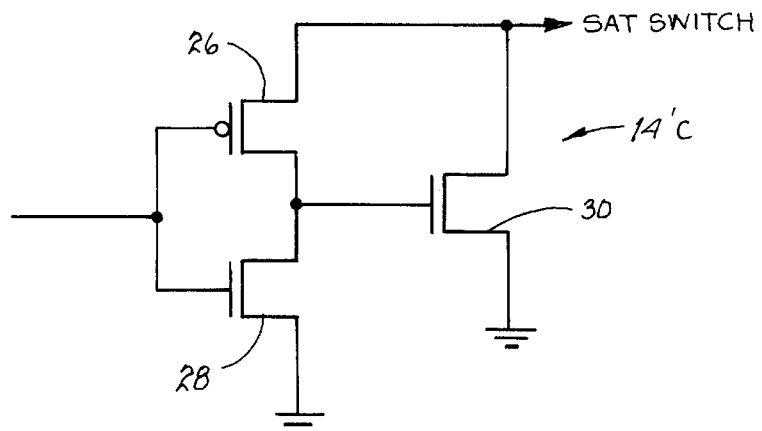
Fig. 4

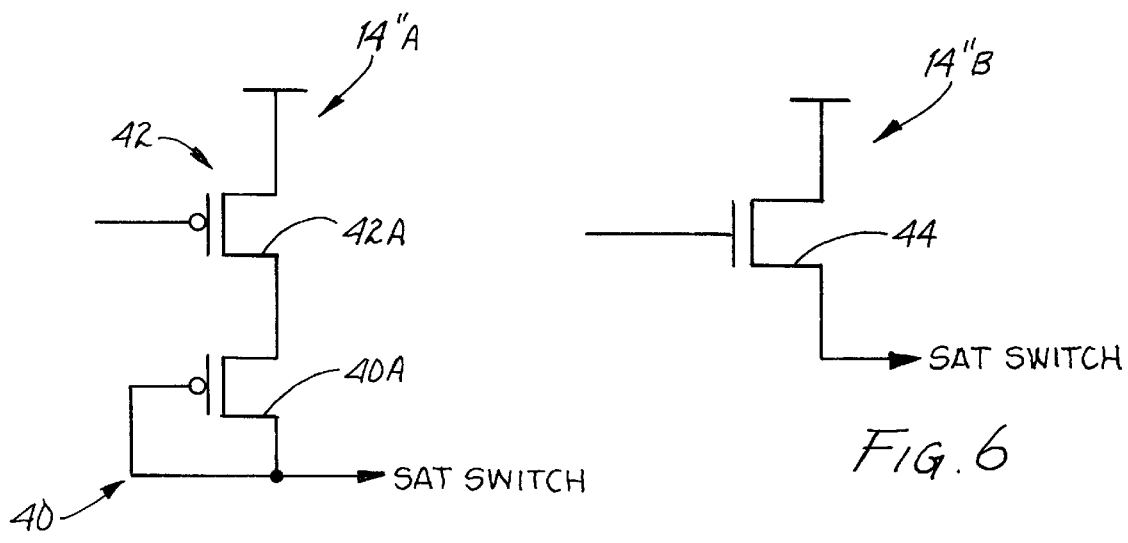
FIG. 5
FIG. 6
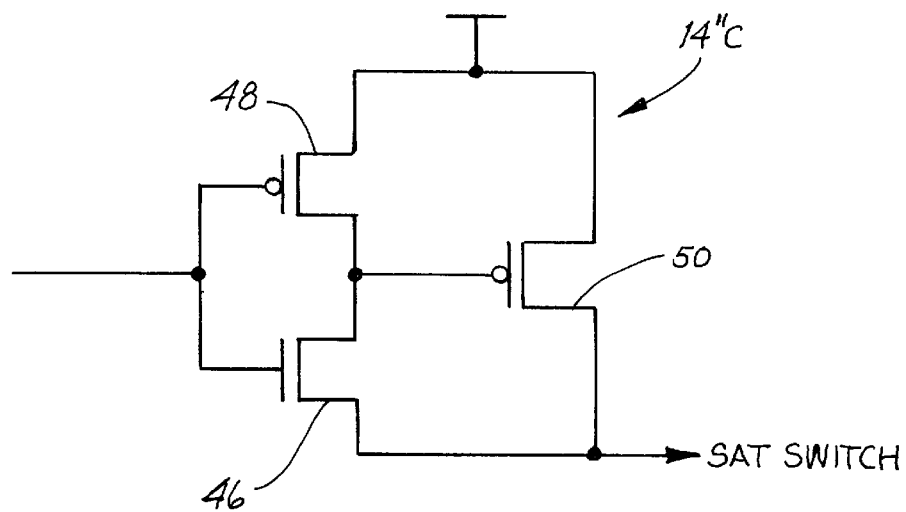
FIG. 7

OUTPUT DRIVER WITH CONSTANT SOURCE IMPEDANCE

BACKGROUND OF THE INVENTION

1. Field of the Invention

This invention relates generally to output drivers and, more specifically, to an output driver that minimizes source-point reflections when driving a transmission line by generating a constant source impedance.

2. Description of the Prior Art

When a driver sends a signal down a transmission line, the signal will travel down the transmission line unaltered until the signal reaches some discontinuity. The discontinuity may be caused by the end of the transmission line, a change in the width of the transmission line, or for any of a number of other reasons. The discontinuity will cause echoes or reflections to be generated which may be sent back to the driver which in turns reflects the echoed signal back on the transmission line to a load.

In order to reduce the reflections on the transmission line, transmission line termination was used to simulate a continuous unaltered transmission line. Termination of the transmission line may occur on either end of the transmission line. For example, a resistor may be placed on the end of the transmission line furthest from the driver. When the driver sends the signal wave on the transmission line, the signal wave will travel down the transmission line until the signal wave hits the resistor. The energy of the signal wave is absorbed by the resistor and no reflection is generated.

By terminating the transmission line at the end furthest from the driver, several problems are created. If a point load is placed in the middle of the transmission line, a partial reflection will be generated by the point load. The partial reflection will be sent back to the driver and can be reflected back around from the driver to the point load. Furthermore, the use of a shunt resistor at the end of the transmission line complicates the integrated circuit (IC) board layout. Shunt resistors consume valuable silicon real estate and require large amounts of power.

The simple solution to the above problem is to have controlled impedance at the source of the transmission line. However, in the implementation of a typical CMOS driver, the CMOS driver's output impedance is high if the CMOS driver is operating in a saturation mode. Since the CMOS driver is in a saturation mode in the incident wave state, reflections such as those from the point loads are reflected back in phase to the point loads. This increases the net settling time of the transmission line.

Therefore, a need existed to provide an improved output driver. The improved output driver must generate a constant source impedance. This will allow the improved output driver to minimize source point reflections when driving a signal on a transmission line.

SUMMARY OF THE INVENTION

In accordance with one embodiment of the present invention, it is an object of the present invention to provide an improved output driver.

It is another object of the present invention to provide an improved output driver that minimizes source-point reflections.

It is another object of the present invention to provide an improved output driver that minimizes source point reflections when driving a signal on a transmission line by generating a constant source impedance.

BRIEF DESCRIPTION OF THE PREFERRED EMBODIMENTS

In accordance with one embodiment of the present invention, an output driver which generates a constant source impedance is disclosed. The output driver uses transistor switching means for generating a nearly constant channel impedance when the transistor switching means is enabled and the transistor switching means is not operating in a saturation mode. Switched diode means are coupled in parallel to the transistor switching means for generating a nearly constant source impedance when a sufficient voltage to bias the switch diode means is applied. Control means are coupled to both the transistor switching means and to the switched diode means. The control means are used for enabling and disabling the transistor switching means and the switched diode means to generate a constant source impedance.

In accordance with another embodiment of the present invention, a CMOS output driver having a constant source impedance is disclosed. The CMOS output driver uses pull-down driver means for generating a constant source impedance when a signal is sent to the pull-down driver means. Pull-up driver means are provided for generating a constant source impedance when a signal is sent to the pull-up driver means. Control means are coupled to the pull-down driver means and to the pull-up driver means for enabling and disabling the pull-down driver means and for enabling and disabling the pull-up driver means in order to generate a constant source impedance. Both the pull-down driver means and the pull-up driver means are comprised of transistor switching means for generating a nearly constant channel impedance when the transistor switching means is enabled and is not operating in a saturation mode, and switched diode means coupled in parallel to the transistor switching means for generating a nearly constant source impedance when a sufficient voltage to bias the switch diode means is applied.

The foregoing and other objects, features, and advantages of the invention will be apparent from the following, more particular, description of the preferred embodiments of the invention, as illustrated in the accompanying drawings.

BRIEF DESCRIPTION OF THE DRAWINGS

FIG. 1 is a functional block diagram of an output driver of the present invention which generates a constant source impedance.

FIG. 2 is a simplified electrical schematic of one embodiment of the switched diode used in the output driver of FIG. 1 when an NMOS transistor is used as a saturation switch.

FIG. 3 is a simplified electrical schematic of a second embodiment of the switched diode used in the output driver of FIG. 1 when an NMOS transistor is used as a saturation switch.

FIG. 4 is a simplified electrical schematic of a third embodiment of the switched diode used in the output driver of FIG. 1 when an NMOS transistor is used as a saturation switch.

FIG. 5 is a simplified electrical schematic of one embodiment of the switched diode used in the output driver of FIG. 1 when a PMOS transistor is used as a saturation switch.

FIG. 6 is a simplified electrical schematic of a second embodiment of the switched diode used in the output driver of FIG. 1 when a PMOS transistor is used as a saturation switch.

FIG. 7 is a simplified electrical schematic of a third embodiment of the switched diode used in the output driver of FIG. 1 when a PMOS transistor is used as a saturation switch.

DETAILED DESCRIPTION OF THE PREFERRED EMBODIMENTS

Figure 10:
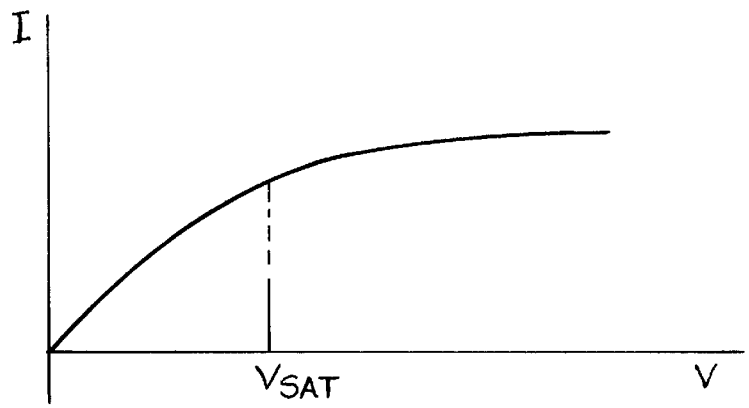
FIG. 10 depicts the I-V characteristics for the saturation switch depicted in FIG. 1.

Referring to FIG. 1, an output driver which has a constant source impedance 10 (hereinafter output driver 10) is shown. The output driver 10 provides controlled impedance at the source of the transmission line in order to reduce the source point reflections when driving a signal on a transmission line. The output driver 10 uses a saturation switch 12 for generating a nearly constant channel impedance. As shown in FIG. 10, the saturation switch 12 has a fairly linear channel impedance when the saturation switch 12 is enabled and the saturation switch is not operating in a saturation mode. However, when the saturation switch is operating in a saturation mode (i.e., voltages greater than $V_{SAT}$) a nearly constant current is generated. In reflective wave switching with no external termination, ideally, if an initial step is placed on the transmission line, when the reflective wave comes back, the reflective wave could be absorbed. However, in order to place an initial step on the line that is large enough to absorb the reflective wave, a voltage must be applied that takes the saturation switch into a saturation mode (i.e., constant current). This causes several problems. First, since the I-V curve (FIG. 10) is nonlinear in the saturation area, the step on the line will take the reflective wave past the requisite position (i.e., past zero). Second, point sources on the transmission line will cause small reflections to be sent back to an essentially open circuit. This is due to the fact that the saturation switch 12 has a high impedance when operating in a saturation mode. The reflections come back to the high impedance source which causes the reflections to be reflected back in phase back down the transmission line.

Figure 11:
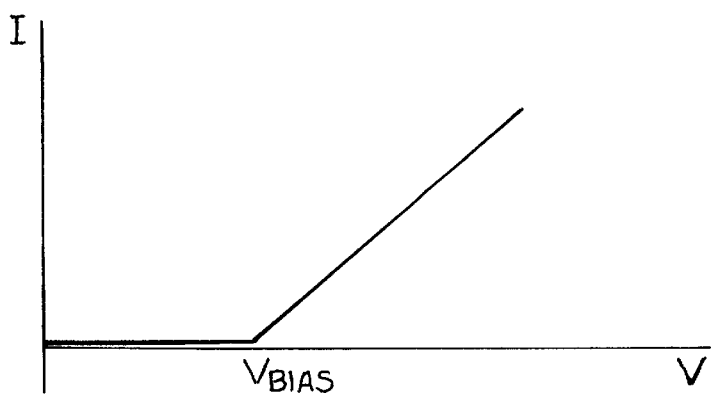
FIG. 11 depicts the I-V characteristics for the switch diode depicted in FIG. 1.

In order to solve the above problems and to have an output driver 10 with a constant source impedance, a switched diode circuit 14 is coupled in parallel to the saturation switch 12. The switch diode circuit 14 is used for generating a nearly constant source impedance when a sufficient voltage to bias the switch diode circuit 14 is applied. The I-V characteristics of the switch diode circuit 14 is shown in FIG. 11. As can be seen from FIG. 11, once a sufficient voltage (i.e., $V_{BIAS}$) is applied, the switch diode circuit 14 has a fairly linear impedance.

Control circuitry 16 is coupled to both the saturation switch 12 and to the switched diode circuit 14. The control circuitry 16 is used for enabling and disabling the saturation switch 12 and the switched diode circuit 14. By alternatively enabling and disabling the saturation switch 12 and the switched diode circuit 14, the control circuitry 16 allows the output driver 10 to generate a constant source impedance.

In general, some type of driver circuitry is coupled to an input of the control circuitry 16. The driver circuitry is used for driving signals on the transmission line. Driver circuits are known to those skilled in the art and will not be further discussed.

In accordance with one embodiment of the present invention, the saturation switch 12 is comprised of an NMOS transistor 12A (FIG. 8) having a gate coupled to the control circuitry 16 and a drain coupled to the switch diode circuit 14. The NMOS transistor switch will have the I-V characteristics of that shown in FIG. 10. When the NMOS transistor 12A is used as the saturation switch 12, the switch diode circuit 14 can take on several forms. Referring to FIG. 2, one embodiment of the switch diode circuit 14'A is shown when the NMOS transistor 12A is used as a saturation switch 12. The switch diode circuit 14'A has a diode device 20 for generating a nearly constant source impedance. A switching device 22 is coupled to the diode device 20 for sending a signal to turn on and for sending a signal to turn off the diode device 20. The switching device 22 is comprised of an NMOS transistor 22A having a drain coupled to the diode device 20 and a gate coupled to the control circuitry 16 (FIG. 1). The diode device 20 is comprised of a second NMOS transistor 20A having a gate coupled to a drain of the second NMOS transistor 20A and a source coupled to the drain of the first NMOS transistor 22A. In operation, when the control circuitry 16 enables the switch diode 14'A, a signal will be sent to the first NMOS transistor 22A. When a sufficient voltage is applied, the first NMOS transistor 22A will be turned on. This will in turn activate the second NMOS transistor 20A which is functioning as a diode device 20. The diode device 20 will produce I-V characteristics like that shown in FIG. 11 when a sufficient voltage $V_{BIAS}$ is applied.

Referring to FIG. 3, a second embodiment of the switch diode circuit 14'B is shown when the NMOS transistor 12A (FIG. 8) is used as a saturation switch 12. In this embodiment of the present invention, the switch diode 14'B is a complementary follower circuit. The complementary follower circuit is implemented by a PMOS transistor 24 having a gate coupled to the control circuitry 16 (FIG. 1) and a source coupled to the NMOS transistor 12A acting as the saturation switch 12. The PMOS transistor 24 will have the same I-V characteristics as that shown in FIG. 11.

Referring to FIG. 4, a third embodiment of the switch diode circuit 14'C is shown when the NMOS transistor 12A (FIG. 8) is used as the saturation switch 12. In this embodiment, the switched diode circuit 14'C is comprised of several transistors one of which is a PMOS transistor 26 having a gate coupled to the control circuitry 16 (FIG. 1). A first NMOS transistor 28 is provided and has a gate coupled to the gate of the PMOS transistor 26. A drain of the first NMOS transistor 28 is coupled to a drain of the PMOS transistor 26. A second NMOS transistor 30 is provided and has a gate coupled to the drain of the first NMOS transistor 28 and a drain coupled to a source of the PMOS transistor 26. In operation, when a signal is supplied from the control circuitry 16 to activate the PMOS transistor 26, the second NMOS transistor 30 functions as a diode and has the I-V characteristics depicted in FIG. 11. When the voltage to the first NMOS transistor 28 is sufficient to turn on the first NMOS transistor 28, the PMOS transistor 26 will be turned off which will turn off the second NMOS transistor 30.

In accordance with another embodiment of the present invention, the saturation switch 12 is comprised of a PMOS transistor 12B (FIG. 9) having a gate coupled to the control circuitry 16 (FIG. 1) and a drain coupled to the switch diode circuit 14 (FIG. 1). The PMOS transistor 12B will have the I-V characteristics of that shown in FIG. 10. In this embodiment of the present invention, as with the previous embodiment, the switch diode circuit 14 can take on several forms. Referring to FIG. 5, one embodiment of the switch diode circuit 14"A is shown when a PMOS transistor 12B is used as a saturation switch 12 (FIG. 1). The switch diode circuit 14"A has a diode device 40 for generating a nearly constant source impedance. A switching device 42 is coupled to the diode means for sending a signal to turn on and for sending a signal to turn off the diode device 40. The switching device 42 is comprised of a PMOS transistor 42A having a drain coupled to the diode device 40 and a gate coupled to the control circuitry 16 (FIG. 1). The diode device 40 is comprised of a second PMOS transistor 40A having a gate coupled to a drain of the second PMOS transistor 40A and a source coupled to the drain of the first PMOS transistor 42A. In operation, when the control circuitry 16 enables the switch diode 14"A, a signal will be sent to the first PMOS transistor 42A which will turn on the first PMOS transistor 42A. This will in turn activate the second PMOS transistor 40A which is functioning as a diode device 40. The diode device 40 will produce I-V characteristics like that shown in FIG. 11 when a sufficient voltage $V_{BIAS}$ is applied.

Referring to FIG. 6, a second embodiment of the switch diode 14"B is shown when the PMOS transistor 12B (FIG. 9) is used as the saturation switch 12 (FIG. 1). In this embodiment of the present invention, the switch diode 14"B is a complementary follower circuit. The complementary follower circuit is implemented by an NMOS transistor 44 having a gate coupled to the control circuitry 16 (FIG. 1) and a source coupled to the drain of the PMOS transistor 12B. The NMOS transistor 44 will have the same I-V characteristics as that shown in FIG. 11.

Referring to FIG. 7, a third embodiment of the switch diode circuit 14"C is shown when the PMOS transistor 12B (FIG. 9) is used as the saturation switch 12 (FIG. 1). In this embodiment, the switched diode circuit 14"C is comprised of several transistors one of which is a an NMOS transistor 46 having a gate coupled to the control circuitry 16 (FIG. 1). A first PMOS transistor 48 is provided and has a gate coupled to the gate of the NMOS transistor 46. A drain of the first PMOS transistor 48 is coupled to a drain of the NMOS transistor 46. A second PMOS transistor 50 is provided and has a gate coupled to the drain of the first PMOS transistor 48 and a drain coupled to a source of the NMOS transistor 46. In operation, when a signal is supplied from the control circuitry 16 to activate the NMOS transistor 46, the second PMOS transistor 50 functions as a diode and has the I-V characteristics depicted in FIG. 11. When the voltage to the first PMOS transistor 48 is sufficient to turn on the first PMOS transistor 48, the NMOS transistor 46 will be turned off, which will turn off the second PMOS transistor 50.

Figures 8, 9:
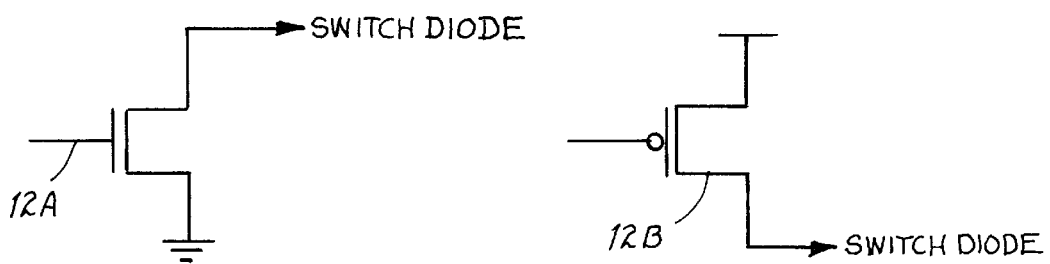
FIG. 8 is a simplified electrical schematic of the NMOS transistor used as the saturation switch for the embodiments depicted in FIGS. 2–4.
FIG. 9 is a simplified electrical schematic of the PMOS transistor used as the saturation switch for the embodiments depicted in FIGS. 5–7.
Figure 12:
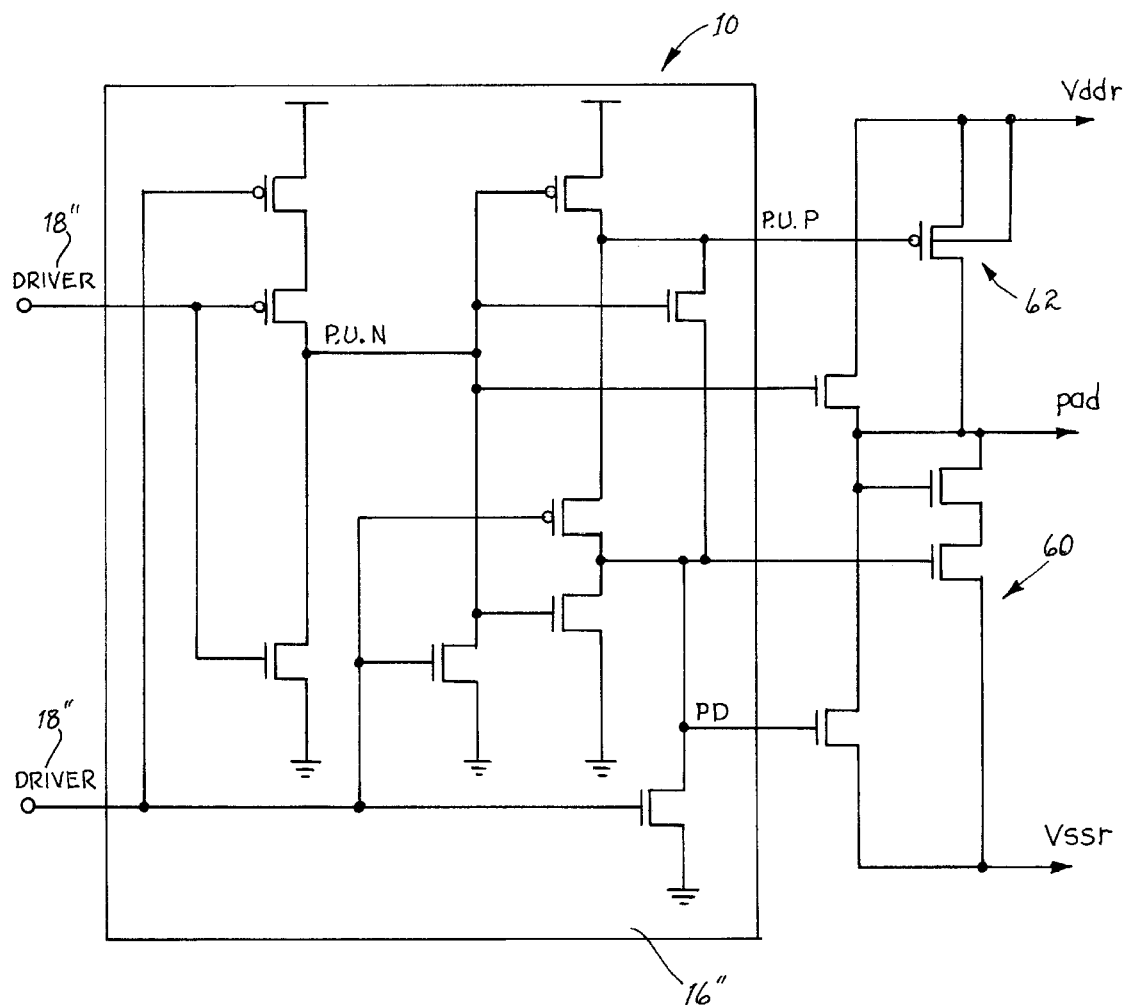
FIG. 12 is a simplified electrical schematic of one embodiment of a CMOS output driver of the present invention which can generate a constant source impedance.

Referring now to FIG. 12, another embodiment of the present invention is shown. In this embodiment, the output driver 10 is a CMOS output driver 10" with a constant source impedance. The CMOS output driver 10" is comprised of a pull-down driver 60 for generating a constant source impedance when a signal is sent to the pull-down driver 60 and a pull-up driver 62 for generating a constant source impedance when a signal is sent to the pull-up driver 62. Control circuitry 16" is coupled to both the pull-down driver 60 and to the pull-up driver 62 for enabling and disabling the pull-down driver 60 and for enabling and disabling the pull-up driver 62. Driver circuitry 18" is coupled to the control means for driving signals on a transmission line. Both the pull-down driver 60 and the pull-up driver 62 are implemented as described above for the different embodiments of the output driver 10. FIG. 8 shows one embodiment for implementing the CMOS output driver 10".

While the invention has been particularly shown and described with reference to preferred embodiments thereof, it will be understood by those skilled in the art that the foregoing and other changes in form, and details may be made therein without departing from the spirit and scope of the invention.

What is claimed is:

1. An output driver with a constant source impedance for driving a load comprising, in combination:

transistor switching means coupled to said load for providing a nearly constant transistor channel impedance when said transistor switching means is enabled and said transistor switching means is not operating in a saturation mode;

switched diode connected MOS device means coupled to said load and coupled in parallel to said transistor switching means for providing a nearly constant drain-source impedance in said switched diode connected MOS device means when said transistor switching means is operating in a saturation mode;

control means coupled to said transistor switching means and to said switched diode connected MOS device means for enabling and disabling said transistor switching means and said switched diode connected MOS device means to provide said constant source impedance; and wherein each of said transistor switching means and said switched diode connected MOS device means are of substantially matched dynamic impedance.

2. An output driver in accordance with claim 1 wherein said transistor switching means is a first NMOS transistor having a gate coupled to said control means and a drain coupled to said switched diode connected MOS device means.

3. An output driver in accordance with claim 2 wherein said switched diode connected MOS device means comprises:

diode connected MOS device means for providing a nearly constant drain-source impedance; and switch means coupled to said diode connected MOS device means and to said control means for turning on and for turning off said diode connected MOS device means.

4. An output driver in accordance with claim 3 wherein said switch means is a second NMOS transistor having a drain coupled to said diode connected MOS device means and a gate coupled to said control means.

5. An output driver in accordance with claim 4 wherein said diode connected MOS device means is a third NMOS transistor having a gate coupled to a drain of said third NMOS transistor and a source coupled to said drain of said second NMOS transistor.

6. An output driver in accordance with claim 2 wherein said switched diode connected MOS device means comprises a complementary follower circuit.

7. An output driver in accordance with claim 6 wherein said complementary follower circuit is a first PMOS transistor having a gate coupled to said control means and a source coupled to said first NMOS transistor of said transistor switching means.

8. An output driver in accordance with claim 2 wherein said switched diode connected MOS device means comprises:

a first PMOS transistor;

a second NMOS transistor having a gate coupled to a gate of said first PMOS transistor and a drain coupled to a drain of said first PMOS transistor; and a third NMOS transistor having a gate coupled to said drain of said second NMOS transistor and a drain coupled to a source of said first PMOS transistor.

9. An output driver in accordance with claim 1 wherein said transistor switching means is a first PMOS transistor having a gate coupled to said control means and a drain coupled to said switched diode connected MOS device means.

10. An output driver in accordance with claim 9 wherein said switched diode connected MOS device means comprises:

diode connected MOS device means for providing a nearly constant drain-source impedance; and switch means coupled to said diode connected MOS device means and to said control means for turning on and for turning off said diode connected MOS device means.

11. An output driver in accordance with claim 10 wherein said switch means is a second PMOS transistor having a drain coupled to said diode connected MOS device means and a gate coupled to said control means.

12. An output driver in accordance with claim 11 wherein said diode connected MOS device means is a third PMOS transistor having a gate coupled to a drain of said third PMOS transistor and a source coupled to said drain of said second PMOS transistor.

13. An output driver in accordance with claim 9 wherein said switched diode connected MOS device means comprises a complementary follower circuit.

14. An output driver in accordance with claim 13 wherein said complementary follower circuit is a first NMOS transistor having a gate coupled to said control means and a source coupled to said drain of said first PMOS transistor of said transistor switching means.

15. An output driver in accordance with claim 9 wherein said switched diode connected MOS device means comprises:

a first NMOS transistor;

a second PMOS transistor having a gate coupled to a gate of said first NMOS transistor and a drain coupled to a drain of said first NMOS transistor; and a third PMOS transistor having a gate coupled to said drain of said second PMOS transistor and a drain coupled to a source of said first NMOS transistor.

16. A CMOS output driver having a constant source impedance for driving a load comprising, in combination:

pull-down driver means coupled to said load for providing a constant source impedance in response to a first control signal, wherein said pull-down driver means comprises:

pull-down driver transistor switching means coupled to a control means for providing a nearly constant transistor channel impedance when said pull-down driver transistor switching means is enabled by said control means and not operating in a saturation mode;

pull-down driver switched diode connected MOS device means coupled to said control means and coupled in parallel to said pull-down driver transistor switching means for providing a nearly constant drain-source impedance in said pull-down driver switched diode connected MOS device when said pull-down driver transistor switching means is operating in a saturation mode;

pull-up driver means coupled to said load for providing said constant source impedance in response to a second control signal; and control means coupled to said pull-down driver means and to said pull-up driver means for providing said first control signal a second control signal to enable and disable said pull-down driver means and to enable and disable said pull-up driver means to provide said constant source impedance; and wherein each of said pull-down driver transistor switching means and said pull-down driver switched diode connected MOS device means are of substantially matched dynamic impedance.

17. A CMOS output driver in accordance with claim 16 wherein said pull-down driver transistor switching means is a first NMOS transistor having a gate coupled to said control means and a drain coupled to said pull-down driver switched diode connected MOS device means.

18. A CMOS output driver in accordance with claim 17 wherein said pull-down driver switched diode connected MOS device means comprises:

diode connected MOS device means for providing a nearly constant drain-source impedance; and switch means coupled to said diode connected MOS device means and to said control means for turning on and for turning off said diode connected MOS device means.

19. A CMOS output driver in accordance with claim 18 wherein said switch means comprises second NMOS transistor means having a drain coupled to said diode connected MOS device means and a gate coupled to said control means for turning on and for turning off said diode connected MOS device means.

20. A CMOS output driver in accordance with claim 19 wherein said diode connected MOS device means comprises third NMOS transistor means having a gate coupled to a drain of said third NMOS transistor means and a source coupled to said drain of said second NMOS transistor means for providing a nearly constant drain-source impedance.

21. A CMOS output driver in accordance with claim 17 wherein said pull-down driver switched diode connected MOS device means comprises a complementary follower circuit.

22. A CMOS driver in accordance with claim 21 wherein said complementary follower circuit is a PMOS transistor having a gate coupled to said control means and a source coupled to said NMOS transistor of said pull-down driver transistor switching means.

23. A CMOS output driver in accordance with claim 17 wherein said pull-down driver switched diode connected MOS device means comprises:

a first PMOS transistor;

a second NMOS transistor having a gate coupled to a gate of said first PMOS transistor and a drain coupled to a drain of said first PMOS transistor; and a third NMOS transistor having a gate coupled to said drain of said second NMOS transistor and a drain coupled to a source of said first PMOS transistor.

24. A CMOS output driver in accordance with claim 16 wherein said pull-up driver means comprises:

pull-up driver transistor switching means coupled to said control means for providing said nearly constant transistor channel impedance when said pull-up driver transistor switching means is enabled by said control means and not operating in a saturation mode; and pull-up driver switched diode connected MOS device means coupled to said control means and coupled in parallel to said pull-up driver transistor switching means for providing said nearly constant drain-source impedance in said pull-up driver switched diode connected MOS device means when said pull-up driver transistor switching means is operating in said saturation mode.

25. An output driver in accordance claim 24 wherein said pull-up driver transistor switching means is a first MOS transistor having a gate coupled to said control means and a drain coupled to said pull-up driver switched diode connected MOS device means.

26. An output driver in accordance with claim 25 wherein said pull-up driver switched diode connected MOS device means comprises:
    diode connected MOS device means for providing said nearly constant drain-source impedance; and
    switch means coupled to said diode connected MOS device means for turning on and for turning off said diode connected MOS device means.

27. An output driver in accordance with claim 26 wherein said switch means is a second PMOS transistor having a drain coupled to said diode connected MOS device means and a gate coupled to said control means.

28. An output driver in accordance with claim 27 wherein said diode connected MOS device means is a third PMOS transistor having a gate coupled to a drain of said third PMOS transistor and a source coupled to said drain of said second PMOS transistor.

29. An output driver in accordance with claim 25 wherein said switched diode connected MOS device means comprises a complementary follower circuit.

30. An output driver in accordance with claim 29 wherein said complementary follower circuit is a first NMOS transistor having a gate coupled to a control means and a source coupled to said drain of said first PMOS transistor of said transistor switching means.

31. An output driver in accordance with claim 25 wherein said switched diode connected MOS device means comprises:
    a first NMOS transistor;
    a first PMOS transistor having a gate coupled to a gate of said first NMOS transistor and a drain coupled to a drain of said first NMOS transistor; and
    a second PMOS transistor having a gate coupled to said drain of said first PMOS transistor and a drain coupled to a source of said first NMOS transistor.

* * * * *